United States Patent
Ohno et al.

(10) Patent No.: US 6,441,391 B1
(45) Date of Patent: Aug. 27, 2002

(54) SEMICONDUCTOR DEVICE HAVING DRAIN AND GATE ELECTRODES FORMED TO LIE ALONG FEW DEGREES OF DIRECTION IN RELATION TO THE SUBSTRATE

(75) Inventors: Yasuo Ohno; Nobuyuki Hayama; Kensuke Kasahara; Tatsuo Nakayama; Hironobu Miyamoto; Yuji Takahashi; Yuji Ando; Kohji Matsunaga; Masaaki Kuzuhara, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/940,374

(22) Filed: Aug. 29, 2001

(30) Foreign Application Priority Data

Sep. 1, 2000 (JP) .......................... 2000-265783

(51) Int. Cl.[7] .............................. H01L 29/06
(52) U.S. Cl. .................. 257/11; 257/183; 257/187; 257/192; 257/201; 257/205
(58) Field of Search ................ 257/183, 187, 257/192, 201, 205

(56) References Cited

FOREIGN PATENT DOCUMENTS

| JP | 7-201745 | 8/1995 |
| JP | 7-297495 | 11/1995 |
| JP | 9-045988 | 2/1997 |
| JP | 11-031864 | 2/1999 |
| JP | 11-261169 | 9/1999 |
| JP | 2000-082671 | 3/2000 |

OTHER PUBLICATIONS

"Characteristics of a GaN Metal Semiconductor Field–Effect Transistor Grown on a Sapphire Substrate by Metalorganic Chemical Vapor Deposition", T. Egawa et al., Jpn. J. Appln. Phys. vol. 38 (1999), pp. 2630–2633.

Primary Examiner—Fetsum Abraham
(74) Attorney, Agent, or Firm—Sughrue Mion, PLLC

(57) ABSTRACT

An object of the present invention is to improve, in a group III nitride semiconductor device, the productivity, heat radiation characteristic and performance in the element high speed operation; upon a sapphire substrate in which an A plane (an (11-20) plane) is set to be the basal plane, an epitaxial growth layer of a group III nitride semiconductor is formed and, thereon, a gate electrode 16, a source electrode 15 and a drain electrode 17 are formed; these electrodes are disposed in such a way that a direction along which they are laid makes an angle within 20° with respect to a C axis of sapphire.

3 Claims, 5 Drawing Sheets

Gate Width = 200 μm X 10
Gate Spacing = 30 μm
Power Supplied = 1W/mm

SEMICONDUCTOR DEVICE HAVING DRAIN AND GATE ELECTRODES FORMED TO LIE ALONG FEW DEGREES OF DIRECTION IN RELATION TO THE SUBSTRATE

FIELD OF THE INVENTION

The present invention relates to a field effect transistor (FET) with a sapphire substrate, in particular to a field effect transistor utilizing a group III nitride semiconductor material such as GaN.

BACKGROUND TO THE INVENTION

The group III nitride semiconductors including GaN have carrier transport characteristics close to that of GaAs, together with high breakdown electric fields due to their wide band gaps. They are, thus, regarded as strong candidate materials for high frequency, high power transistors.

When a device is manufactured making use of a GaN based semiconductor material, because it is difficult to obtain a bulk GaN based substrate, there is normally employed a method of fabricating a device wherein a GaN based semiconductor layer is formed by epitaxial growth on a substrate of a different material. For the substrate of a different material, sapphire or SiC is utilized. SiC has an excellent thermal conductivity but also drawbacks of high cost and difficulty to attain a large wafer area. In contrast, although sapphire has an inferior thermal conductivity, the cost can be lowered through the use of a wafer with a larger diameter. In application, therefore, these substrates of different materials are chosen appropriately, according to the use and the purpose for utilizing and so forth. In the field of MMICs (Monolithic Microwave Integrated Circuits) or the likes, there are some applications with small electric power in which the restriction for heat dissipation is not strong. In such applications, sapphire rather than SiC is in wide use. When, using a sapphire substrate, a FET is fabricated, in prior art, a C plane sapphire is utilized and the device is formed on the C plane (see Japanese Patent Application Laid-open, No. 82671/2000, Jpn. J. Appl. Phys. Vol.38 (1999) pp.2630 (T. Egawa et al.) and so on). FIG. 5 is a view showing a structure of a conventional MESFET (Metal Semiconductor FET) disclosed in FIG. 12 of Japanese Patent Application Laid-open, No. 82671/2000. Herein, upon a C plane sapphire substrate 51, a GaN buffer layer 52 and an n-type GaN channel layer 53 are laid, and a source electrode 54, a gate electrode 55 and a drain electrode 56 are formed thereon. Meanwhile, FIG. 6 is a view showing a structure of a conventional HEMT (High Electron Mobility Transistor) disclosed in FIG. 13 of the same publication. Upon a C plane sapphire substrate 61, a GaN buffer layer 62, a non-doped GaN channel layer 63 and an n-AlGaN electron supplying layer 64 are laid, and a source electrode 65, a gate electrode 66 and a drain electrode 67 are formed thereon. In both of these, a GaN based semiconductor layer is laid upon a C plane of sapphire to fabricate a FET. Further, it is described, in that publication, that any plane of sapphire such as an A plane, N plane, S plane, R plane, M plane or the like can be utilized in fabricating an optical device or an electronic device with a sapphire substrate. However, examples specifically disclosed therein are nothing else but the ones of forming a device on a C plane of sapphire, and any specific manufacturing methods or device design criteria for the cases to utilize any other plane are not described at all.

As described above, in conventional techniques, aGaN based semiconductor layer is formed upon a C plane of sapphire to form a device, which gives rise to the following problems.

First, attempts to obtain a wafer with a larger diameter are limited to a certain extent. In recent years, from the point of view of improving productivity, there have been demands that wafers should have larger diameters. Yet, the sapphire whose C plane is chosen for the crystal growth plane cannot be readily made to have a larger diameter, because of its low workability through surface polishing due to its poor mechanical processing feasibility and little ability to grow the crystal to have a large width by the ribbon crystal method or the like. A substrate with the largest diameter attained so far is 4 inches in diameter.

Secondly, a heat radiation characteristic thereof is difficult to improve. Since sapphire has a low thermal conductivity, improvements on the heat radiation characteristic have been sought after for some time and, for this purpose, thinner substrates have been looked for. Nevertheless, sapphire has insufficient feasibility in mechanical processing as described above so that a reduction in thickness is hard to achieve and, thus, the heat radiation characteristic is difficult to improve.

Thirdly, parasitic capacitances generated in the substrate are relatively large and act as an inhibitory factor to the improvement of device performance. Especially, in the case of a C plane sapphire, it is necessary to make the substrate have a certain thickness from the point of mechanical processing feasibility, which results in generation of large parasitic capacitances in the substrate.

SUMMARY OF THE INVENTION

In light of the above problems, an object of the present invention is, in a group III nitride semiconductor device, to improve the productivity and heat radiation characteristic and, at the same time, to improve device performance through a reduction in parasitic capacitances.

The present invention relates to a semiconductor device which comprises a group III nitride semiconductor layer formed on a single crystalline sapphire substrate, a source electrode and a drain electrode formed apart from each other on the surface of said group III nitride semiconductor layer, and a gate electrode formed between said source electrode and said drain electrode;
wherein
said group III nitride semiconductor layer is formed on an A plane of said single crystalline sapphire substrate.

The present invention provides a semiconductor device which comprises a group III nitride semiconductor layer formed on a single crystalline sapphire substrate, a source electrode and a drain electrode formed apart from each other on the surface of said group III nitride semiconductor layer, and a gate electrode formed between said source electrode and said drain electrode;
wherein
said group III nitride semiconductor layer is formed on an A plane of said single crystalline sapphire substrate; and the source electrode, the drain electrode and the gate electrode are formed to lie along a direction which makes an angle within 20° with a C axis of said single crystalline sapphire substrate.

In the present invention, a group III nitride semiconductor layer is formed on an A plane of a single crystalline sapphire substrate. FIG. 4 is a view illustrating the orientation of planes of sapphire. In this drawing, a (0001) plane is formed perpendicular to the C axis, and a (11-20) plane is formed to associate with a pair of lateral faces of a hexagonal prism. In the illustration, formed are two {0001} planes (C planes) which are equivalent to (0001), six {11-20} planes (A planes) which are equivalent to (11-20), and six {1-100} planes (M planes) which are equivalent to (1-100), respectively. Among these planes, it is an A plane on which a group III nitride layer is formed to construct a FET in the present invention.

In the field of optical devices such as a semiconductor laser, there are some reports in which the technique to form a group III nitride semiconductor layer upon an A plane of sapphire is examined. For a GaN based optical device, too, although a C plane of a sapphire substrate is very often chosen as the crystal growth plane for a GaN based semiconductor layer, a proposal to use an A plane of sapphire as the crystal growth plane has been put forward, as described in Japanese Patent Application Laid-open No. 297495/1995.

Nevertheless, in the field of electronic devices including FETs, no attempts of forming a device on any plane other than the C plane, in particular on a sapphire A plane, has been made, which can be attributed to the following reasons.

For a FET making use of a group III nitride semiconductor, it is important to utilize carriers generated by the piezoelectric effect and spontaneous polarization effectively, in device designing. Therefore, for growing an epitaxial layer, it becomes essential to use a crystal plane where the piezoelectric effect and spontaneous polarization take place effectively as a growth plane. In other words, in order to form an electronic device on a plane parallel to a C axis, it becomes important to grow a group III nitride semiconductor layer stably in the direction of the C axis. Furthermore, the growth of defects in the group III nitride semiconductor layer leads to inefficient piezoelectric effects through lattice relaxation so that defects such as dislocations need to be reduced. While A reduction of defects is required in a certain extent in the case of semiconductor lasers or the like, in the case of electronic devices where the structure of semiconductor layers is considerably different, the level of the defect reduction required is quite different.

Yet, conventional techniques have not given any clear guide leading to a process for forming a group III nitride semiconductor layer stably in the direction of a C axis while reducing defects.

Meanwhile, a sapphire single crystal has a hexagonal crystal structure. For instance, an A plane of sapphire has, within the plane, an anisotropy of crystal structure between the direction of the C axis and the direction perpendicular to that. In regard of the relative permittivities, the values are 11.5 in the parallel direction to the C axis and 9.3 in the perpendicular direction, respectively, having a difference of about 20%. Consequently, in the case that a FET is to be formed upon a plane other than a C plane, for instance, upon an A plane, required are further examinations of various aspects: whether similar performances to those of a FET with a C plane can be obtained, whether new problems that have not been hitherto seen in the case the formation is made upon a C plane may arise and so forth. Moreover, there is required sufficient knowledge in device design to achieve stable fabrication of FETs with prescribed performances, in spite of difficulties caused by an anisotropy of this sort. However, such examinations have been hardly made so far.

In the present invention, a group III nitride semiconductor layer is formed upon an A plane of sapphire to construct a FET. This provides the following advantages.

First, parasitic capacitances in the longitudinal direction of the substrate can be reduced and thereby the device capability of high speed operation can be improved.

Secondly, the device can be manufactured using a substrate with a large diameter so that the productivity can be greatly improved.

Thirdly, as the substrate can have a superior feasibility in mechanical processing in comparison with that of the C plane sapphire, the substrate can be made thin. In practice, its thickness can be made 100 $\mu$m or less, even not greater than 50 $\mu$m. As a result, heat radiation characteristic of the substrate can be markedly improved and besides parasitic capacitances in the longitudinal direction of the substrate can be reduced even further.

Further, in the present invention, the layout of a FET is set in such a way that a source electrode, a drain electrode and a gate electrode are well aligned within a prescribed range with respect to the direction of the C axis of sapphire, which enables the FET to operate at high speed.

DETAILED DESCRIPTION OF THE INVENTION

Figure 1A:
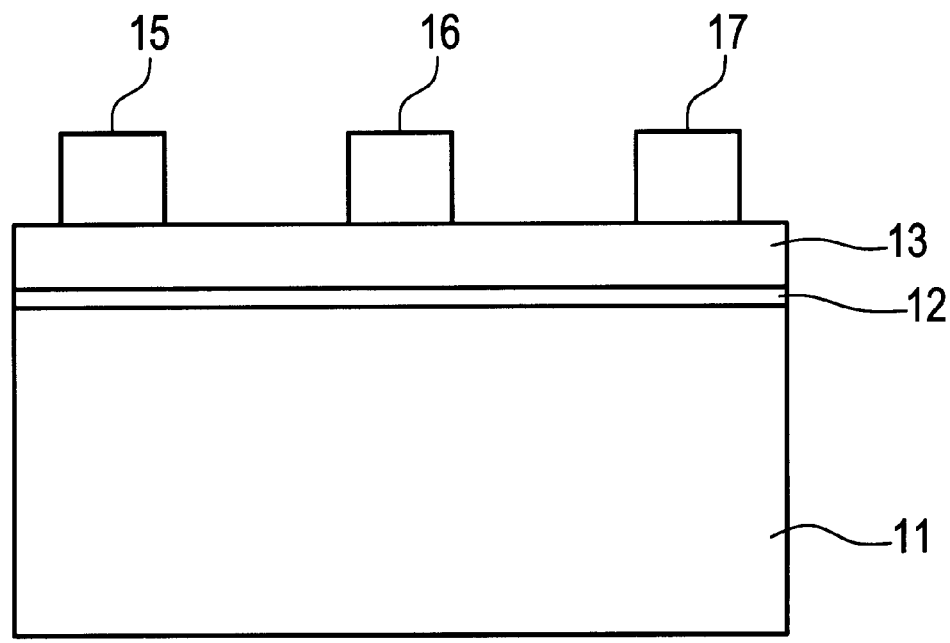
FIG. 1 is a couple of cross-sectional views showing a semiconductor device according to the present invention; the lower view (b) illustrates the electric field created in a FET with a structure shown in the upper view (a), when operating.

The term "the group III nitride semiconductor" in the present invention refers to any semiconductor containing nitrogen as a group V element, including a gallium nitride based semiconductor such as GaN, AlGaN, InGaN, AlGaInN, and also a semiconductor such as AlN, InN.

The present invention can be applied to either of a HEMT and a MESFET. When applied to a HEMT, it takes a structure in which a group III nitride semiconductor layer comprises an operation layer and an electron supply layer formed thereon and at the interface of these layers, a two dimensional electron gas is formed. In the present invention, a group III nitride semiconductor layer is formed on a plane lying parallel to a C axis to construct a FET, which has not been hitherto investigated. In order to form a group III nitride semiconductor layer on a plane lying parallel to a C axis and fabricate stably a FET of high quality, it is important to select appropriately a substrate surface treatment prior to the epitaxial growth, growth conditions and so on. For instance, as described below, it is effective to perform, as a pretreatment prior to the epitaxial growth, an annealing in oxygen or hydrogen under the condition where the temperature is 1100° C. or higher and the duration is 30 minutes or longer. The upper limits for the temperature and the duration can be satisfactorily set to be, for example, not higher than 1600° C. and not longer than 120 minutes, respectively. In addition to this, a technique such as to set the epitaxial growth rate in an appropriate range is effective. With techniques aforementioned, an epitaxial growth layer of high quality where the piezoelectric effect and spontaneous polarization may steadily take place can be obtained.

In the present invention, when the thickness of the sapphire substrate is set to be 100 μm or less, heat radiation characteristic of the substrate can be markedly improved and besides parasitic capacitances in the longitudinal direction of the substrate can be reduced even further.

Further, in the present invention, by setting the thickness of the sapphire substrate to satisfy the following equation:

$$t_{sub} \leq \frac{1}{\alpha} \frac{\varepsilon_{sub}}{\varepsilon_{epi}} \frac{S_{pad}}{S_{gate}} t_{act},$$

where $S_{pad}$ is the area of the pad electrode;

$S_{gate}$ is the area of the gate electrode;

$\varepsilon_{sub}$ is the relative permittivity of the sapphire substrate in the direction of the thickness;

$\varepsilon_{epi}$ is the relative permittivity of the group III nitride semiconductor layer in the direction of the thickness;

$t_{sub}$ is the thickness of the sapphire substrate; and $t_{act}$ is the effective thickness of the group III nitride semiconductor layer,the degradation of the FET high frequency characteristic caused by parasitic capacitances that is attributed to the pad electrodes can be suppressed. Here, the pad electrodes refer to electrodes to supply current for a source or a drain from the outside. Further, $t_{act}$ (the effective thickness of the group III nitride semiconductor layer) represents the distance from the interface of the gate electrode and the surface of the semiconductor layer to the layered region where carriers are accumulating. For instance, in a HEMT, this refers to the distance between the lower end of the gate electrode and the two-dimensional electron gas layer, while, in a MESFET, this refers to the thickness of the depletion layer under the gate electrode. Now, referring to the figures, the point described above is explained in detail below.

Figure 3:
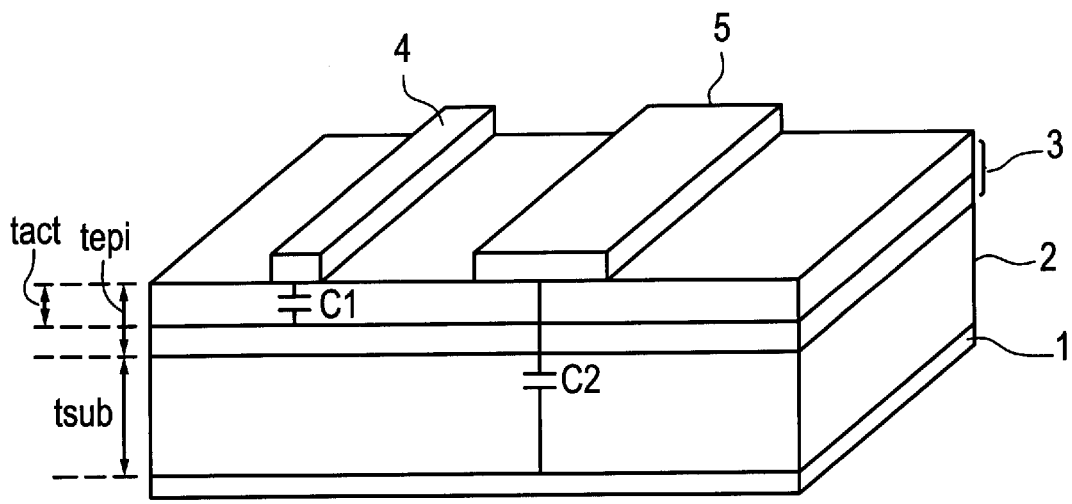
FIG. 3 is a view in explaining the operation of the present invention resulting in an excellent performance of a semiconductor device.
Figure 4:
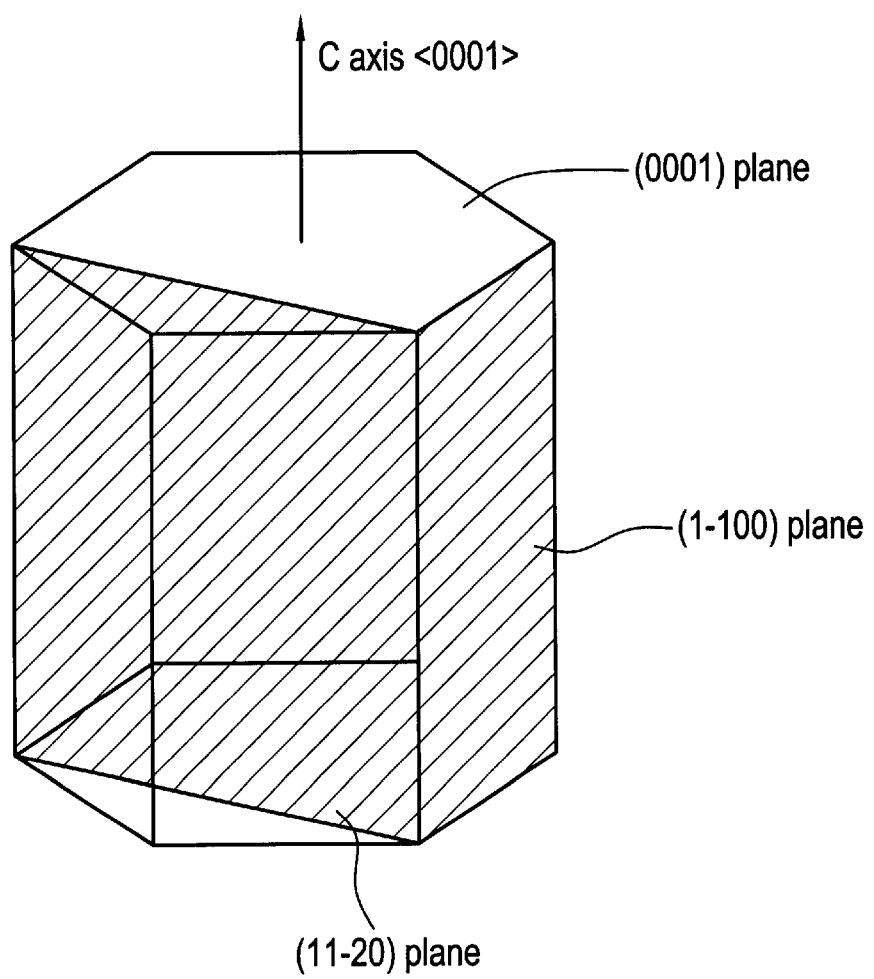
FIG. 4 is a view illustrating the orientation of planes in a single crystalline sapphire.
Figure 5:
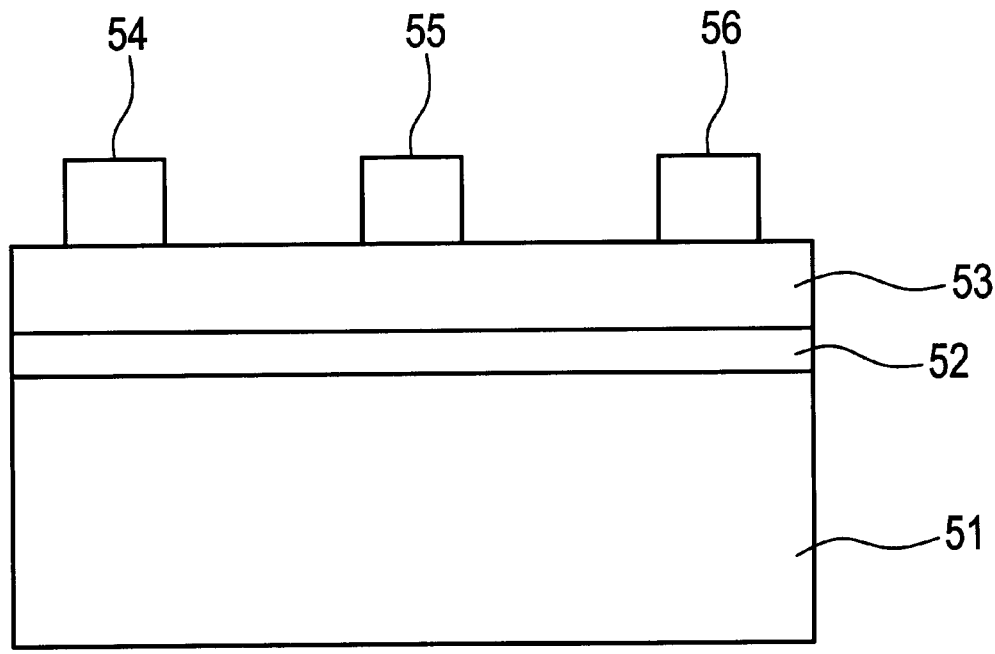
FIG. 5 is a cross-sectional view showing a conventional semiconductor device with FET structure.
Figure 6:
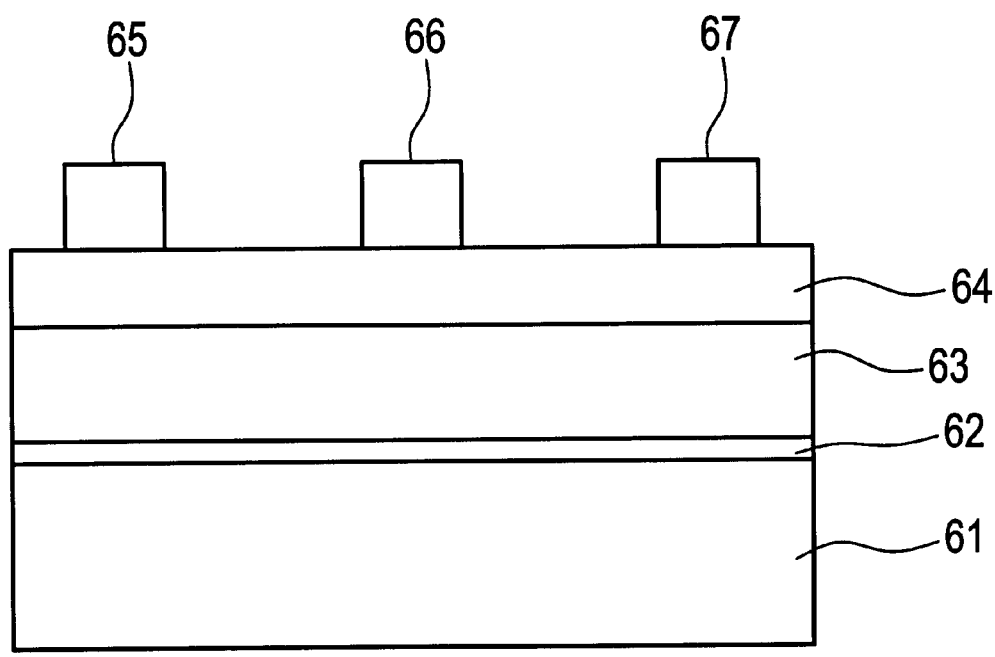
FIG. 6 is a cross-sectional view showing another conventional semiconductor device with HEMT structure.

FIG. 3 is a schematic view showing a structure of a GaN based HEMT. Herein, upon a sapphire substrate 2, a GaN based semiconductor epitaxial growth layer 3 is laid and, on its surface, a gate electrode 4 and a pad electrode 5 are formed. In this figure, source and drain electrodes, interconnections and the likes are omitted. On the back face of the sapphire substrate 2, a ground conductor layer 1 is set. The pad electrode fills the role of supplying the transistor with electric power fed from the outside. In the transistor having such a structure, parasitic capacitances $C_1$ and $C_2$ are generated immediately under the gate electrode 4 and immediately under the pad electrode 5, respectively, as illustrated in the figure. The amounts of $C_1$ and $C_2$ can be expressed as follows:

$$C_2 = \varepsilon_0 \frac{\varepsilon_{sub} \varepsilon_{epi}}{\varepsilon_{epi} t_{sub} + \varepsilon_{sub} t_{epi}} S_{pad} \quad \text{(A)}$$

$$\approx \varepsilon_0 \varepsilon_{sub} S_{pad} / t_{act}$$

$$C_1 = \varepsilon_0 \varepsilon_{epi} S_{gate} / t_{act} \quad \text{(B)}$$

where $S_{pad}$ is the area of the pad electrode 5;

$S_{gate}$ is the area of the gate electrode 4;

$\varepsilon_{sub}$ is the relative permittivity of the sapphire substrate 2;

$\varepsilon_{epi}$ is the relative permittivity of the GaN based semiconductor epitaxial growth layer 3;

$t_{sub}$ is the thickness of the sapphire substrate 2;

$t_{epi}$ is the thickness of the GaN based semiconductor epitaxial growth layer 3; and $t_{act}$ is the effective thickness of the GaN based semiconductor epitaxial growth layer 3.

While the GaN based semiconductor epitaxial growth layer is normally equal to or less than 1 μm, and for instance, within 0.02 to 0.05 μm in thickness, the substrate thickness is, for example, as large as 10 μm so that the approximation presented in Equation (A) can be accepted. If the amount of the parasitic capacitance $C_2$ due to the pad electrode is made to be within 10% and preferably within 5% of the amount of the parasitic capacitance $C_1$ due to the gate electrode, degradation of high frequency characteristic for a transistor can be suppressed. With the condition of 10% limit being taken, the contribution of the parasitic capacitance $C_2$ becomes significant, when condition following is satisfied:

$$C_2 \geq C_1 \times 0.1$$

Substituting the above Equations (A) and (B) into this equation, the following Equation (1) is given.

$$t_{sub} \leq 10 \frac{\varepsilon_{sub}}{\varepsilon_{epi}} \frac{S_{pad}}{S_{gate}} t_{act} \quad (1)$$

When a substrate thickness satisfying this equation is taken, the contribution of the parasitic capacitance under the pad electrode becomes significant and, thus, an application of the present invention that reduces the relative permittivity in the direction of the substrate thickness becomes even more effective. That is, aiming at success in improving heat radiation characteristic and reducing the parasitic capacitances in the direction of the substrate thickness, it is preferable to make the substrate thickness as thin as possible. However, in conventional techniques making use of a C plane of sapphire, not only the mechanical strength of the substrate is insufficient but also a problem of generation of the parasitic capacitance under the pad electrode may arise if a substrate thickness satisfying Equation (1) is taken so that there is a limitation to thin the substrate. In contrast, according to the present invention which reduces the relative permittivity in the direction of the substrate thickness, since the absolute value of the parasitic capacitance under the pad electrode can be lessened, the contribution of the parasitic capacitance under the pad electrode can be eliminated even if the sapphire substrate is made thin; and degradation of high frequency characteristic of the FET can be also prevented.

Herein, the values of respective parameters are normally in the following ranges.

$S_{pad}/S_{gate}$: 10 to 1000

$\varepsilon_{sub}$: 9.4 to 11.4

$\varepsilon_{epi}$: approximately 9.0

$t_{sub}$: 10 to 600 μm (below 10 μm, a faulty operation of the transistor may arise)

$t_{act}$: 0.02 to 0.05 μm

Taking the above ranges of the parameters into consideration, the range where the contribution of the parasitic capacitances under the pad electrode becomes significant is expressed by $$t_{sub} \leq 50 \text{ μm}.$$

Similarly, if the condition of 5% limit is taken, in the range of $$t_{sub} \leq 100 \ \mu m,$$

the contribution of the parasitic capacitances under the pad electrode becomes noticeable.

The above explanation is concerned with the range of the substrate thickness where the effects of the present invention become more evident, taking a HEMT as an example, but the similar holds for a MESFET. In the case of a HEMT, tact is the distance between the gate electrode and the two-dimensional electron gas layer. In the case of a MESFET, by defining $t_{act}$ as "the thickness of the depletion layer under the gate electrode", the similar argument to the above can be applied thereto, and thus Equation (1) is applicable to every transistor. Further, as the values of respective parameters normally employed for a MESFET are similar to those mentioned above, the range of $t_{sub}$ expressed by Equation (1) is also applied to every transistor.

Now, referring to the drawings, the preferred embodiments of the present invention are described below.

FIG. 1 is a couple of views showing a structure of an AlGaN/GaN heterojunction FET of the present embodiment. A manufacturing process of these FETs is described below.

First, an A plane sapphire (the basal plane is a (11-20) plane) with a diameter of 8 inches is prepared. After cleaning the substrate surface, an annealing is performed in oxygen or hydrogen under the condition, for example, such as at the temperature of 1200° C. and for 60 minutes. In addition to this annealing, an appropriated selection of a growth rate of a semiconductor layer can make the gallium nitride based semiconductor layer grow stably in the direction of a C axis. The defect density of the obtained semiconductor layer can be also made relatively small.

The growth of the gallium nitride semiconductor layer can be conducted, for example, by the MOVPE (Metallo-Organic Vapour Phase Epitaxy) method, as follows. First, at a low temperature of 400 to 650° C., a buffer layer 12 of AlN or GaN is formed. After raising the temperature, an epitaxial layer 13 is grown that comprises a gallium nitride based semiconductor material, which is to constitute the FET.

Using a resist as a mask, N ions are then implanted in so as to isolate an n-layer. The implantation condition is that, for example, an accelerating energy is 100 keV and a dose density is $10^{14}$ cm$^{-2}$.

Next, after Ti and Al are laid by the lift-off technique, an annealing is carried out to form a source electrode 15, a drain electrode 17 and a pad electrode (not shown in the drawing). The thicknesses of Ti and Al are set to be, for example, 20 nm and 200 nm, respectively. The annealing is carried out, for example, at 650° C. for 30 seconds in nitrogen atmosphere.

Next, Ni and Au are laid by the lift-off technique to form a gate electrode 16. The thicknesses of Ni and Au are set to be, for example, 20 nm and 200 nm, respectively.

Subsequently, an oxide film or a SiN film for a protective film is grown and through holes for making contact are formed, and then, by the step of gold plating, an interconnection section is formed. After that, a wafer on which devices are formed is thinned to a thickness of 10 to 50 $\mu$m by such a means as polishing, and, then, broken into chips by dicing. In dicing, it is preferable to utilize (0001) planes and (1-100) planes. By conducting dicing after scribing along intersections of these planes first, dicing can be carried out relatively easily. Thereby, a FET with a structure shown in FIG. 1 can be obtained.

Now, for a high frequency FET, in order to enhance a high frequency performance, the reduction of parasitic capacitance due to the drain electrode, which functions as a signal output electrode, is a matter of more importance. In the present embodiment, the layout in plane of the FET is set to satisfy a prescribed condition, for that purpose.

Figure 1B:
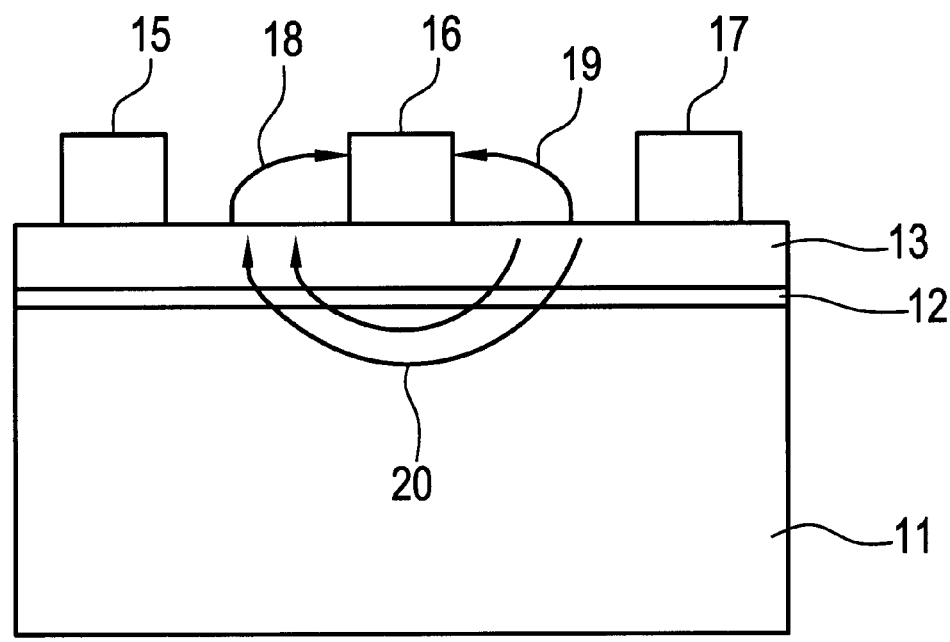

The state of the electric field in a FET of the present embodiment, when operating, is illustrated in FIG. 1(b). In FIG. 1(b), a line of electric force 18 drawn from the source to the gate corresponds to a parasitic capacitance $C_{gs}$ between the gate and the source, while a line of electric force 19 drawn from the drain to the gate corresponds to a parasitic capacitance $C_{gd}$ between the gate and the drain. Further, a line of electric force 20 drawn from the source to the drain correspond to a parasitic capacitance $C_{ds}$ between the drain and the source.

Meanwhile, the cut-off frequency $f_T$ of the FET, dependent on the $C_{gd}$ and $C_{ds}$, both of which are parasitic capacitances attributed to the drain electrode, can be expressed approximately by the following equation, when the transconductance is denoted by $G_m$.

$$f_T = G_m / 2\pi(C_{gd} + C_{ds})$$

Here, $C_{gd}$ is dependent on the relative permittivity of the epitaxial layer 13 and hardly affected by the relative permittivity of the sapphire substrate 11. On the other hand, in respect of $C_{ds}$, a line of electric force 20 corresponding to it passes through the sapphire substrate 11, and its value depends partially on the relative permittivity of the sapphire substrate 11.

Taking the above into consideration, the present inventors conducted device simulations for a FET having a gate length of 1 $\mu$m, a source-drain gap of 3 $\mu$m and a GaN film thickness of 0.5 $\mu$m, assuming that relative permittivity of the substrate therefor is 9.3 or 11.5. In a model wherein the relative permittivity of the substrate was 9.3, the resulting cut-off frequency in the saturation region with $V_{DD}=10$ V was estimated to be 24.5 GHz. In the other model wherein the relative permittivity of the substrate was 11.5, the cut-off frequency was estimated to be 23.3 GHz, indicating clearly there was a difference of about 5% between these two models. In effect, the operational speed changes by 5% with the direction in which the FET is placed on an A plane sapphire. If the gate electrode, the source and drain electrodes are disposed to lie parallel to the C axis of sapphire, the speed of FET operation increases by about 5%, compared with that of the case in which the lying direction is perpendicular thereto.

Next, the results of investigations of the relationship between the layout and the performance of the FET are shown below. When the angle (the deviating angle) forming between the direction along which the gate electrode and the source and drain electrodes of the FET lie and the C axis of the sapphire substrate is taken as α, as shown in FIG. 2(b), the relationship between a and the amount of speed reduction (the amount of speed reduction given by comparison with the speed at α=0) is as shown in the following table.

TABLE 1

| Deviating Angle α (degree) | Amount of Speed Reduction (%) |
|---|---|
| 0 | 0 |
| 12 | 0.1 |
| 16 | 0.2 |
| 20 | 0.3 |

As in practice, it is desirable to keep the amount of speed reduction 0.3% or less, in other words, to make the operational speed 99.7% or more of the maximum speed, the deviating angle α with respect to the direction in the layout to provide the maximum speed is preferably set to be 20° or less.

Further, when the sapphire A plane is utilized, the anisptrophy of the permittivity exists on the plane for device formation, which results in a difference in signal propagation characteristic between pair-transistors and becomes a factor to cause a distortion in the operational amplifier and the like. The amount of this distortion which is proportional to the square value of sin α has the relationship listed in the following table.

TABLE 2

| Deviating Angle α (degree) | Amount of Distortion (%) |
|---|---|
| 6 | 1 |
| 10 | 3 |
| 30 | 25 |
| 45 | 50 |
| 90 | 100 |

As in practice, it is desirable that the amount of distortion is kept to be preferably 3% or less and more preferably 1% or less, set to be preferably 100° or less and more preferably 6° or less with a view to reducing the amount of distortion.

Accordingly, in the present embodiment, the layout in plane of the FET is set as shown in FIG. 2(b) and an angle α made between the direction along which the gate electrode 16, the source 15 and drain electrodes 16 lie and the direction of the sapphire C axis is set to be within 6°. The direction of the drain current is, therefore, substantially perpendicular to the sapphire C axis. Through this arrangement, a FET with an excellent performance in high-speed operation can be obtained.

Further, the structural relationship between a FET of the present embodiment and the pad electrode as well as the substrate is expalned in FIG. 3. Herein, the values of respective parameters are as follows:

$S_{pad}/S_{gate}$ is 100;
$\epsilon_{sub}$ is 9.4;
$\epsilon_{epi}$ is approximately 9.0;
$t_{sub}$ is 10 to 100 μm; and
$t_{act}$ is 0.02 to 0.05 μm.

As described above, the substrate thickness with which a contribution of the parasitic capacitance due to the pad electrode becomes significant is given by the following Equation (1).

$$t_{sub} \leq 10 \frac{\varepsilon_{sub}}{\varepsilon_{epi}} \frac{S_{pad}}{S_{gate}} t_{act} \quad (1)$$

Taking the above ranges of the parameters into consideration, in an example of the present embodiment, the contribution of the pad electrode parasitic capacitance becomes significant in the range of $t_{sub} \leq 52$ μm.

In the present embodiment, the substrate thickness is set to be 10 to 50 μm from the point of view of improving heat radiation characteristic and reducing parasitic capacitances in the direction of the substrate thickness. When the device is formed on a sapphire C plane as the conventional one, with a substrate thickness of this sort, the pad electrode parasitic capacitances cause a problem. In contrast, in the present embodiment, such a problem is solved, because an A plane of sapphire is utilized as a plane for device formation.

EXAMPLES

Example 1

FIG. 1 shows the structure of an AlGaN/GaN heterojunction FET of the present example. This FET was fabricated by a process which comprises the steps of growing a gallium nitride semiconductor layer upon an A plane sapphire substrate (the basal plane thereof is a (11-20) plane) with a diameter of 8 inches, forming electrodes and so on, and thereafter polishing to a thickness of 30 μm and then breaking into chips.

A manufacturing method was the similar one to that mentioned in DETAILED DESCRIPTION OF THE INVENTION above. An annealing after cleaning of the substrate was performed in oxygen at 1200° C. The growth temperature for a low-temperature buffer layer was set at about 650° C., and for other layers at about 1050° C., respectively. An epitaxial layer 12 was made to have a structure wherein the following layers were laid in this order: that is an AlN buffer layer (with a thickness of 100 μm);

a GaN layer (with a thickness of 0.5 μm);

a non-doped $Al_{0.2}Ga_{0.8}N$ layer (with a thickness of 5 nm);

a $4\times10^{18}$ cm$^{-3}$ Si-doped $Al_{0.2}Ga_{0.8}N$ layer (with a thickness of 15 nm); and a non-doped $Al_{0.2}Ga_{0.8}N$ layer (with a thickness of 5 nm).

Further, dicing was performed by utilizing (0001) plane and (1-100) plane.

Figure 2A:
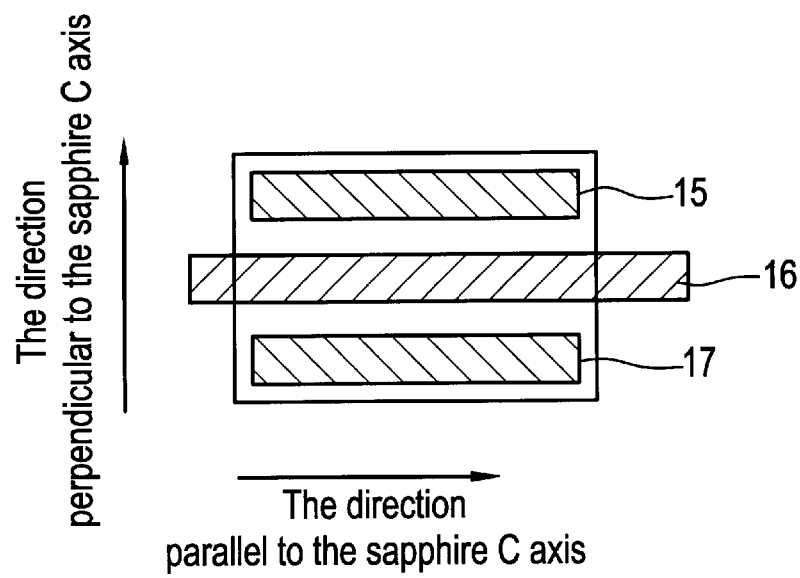
FIG. 2 is a pair of top views showing a semiconductor device according to the present invention; the upper view (a) shows a device with electrodes aligned precisely along the direction of the C axis of sapphire and the lower view (b) shows a device with electrodes aligned along the direction tilted from the C axis by angle $\alpha$.
Figure 2B:
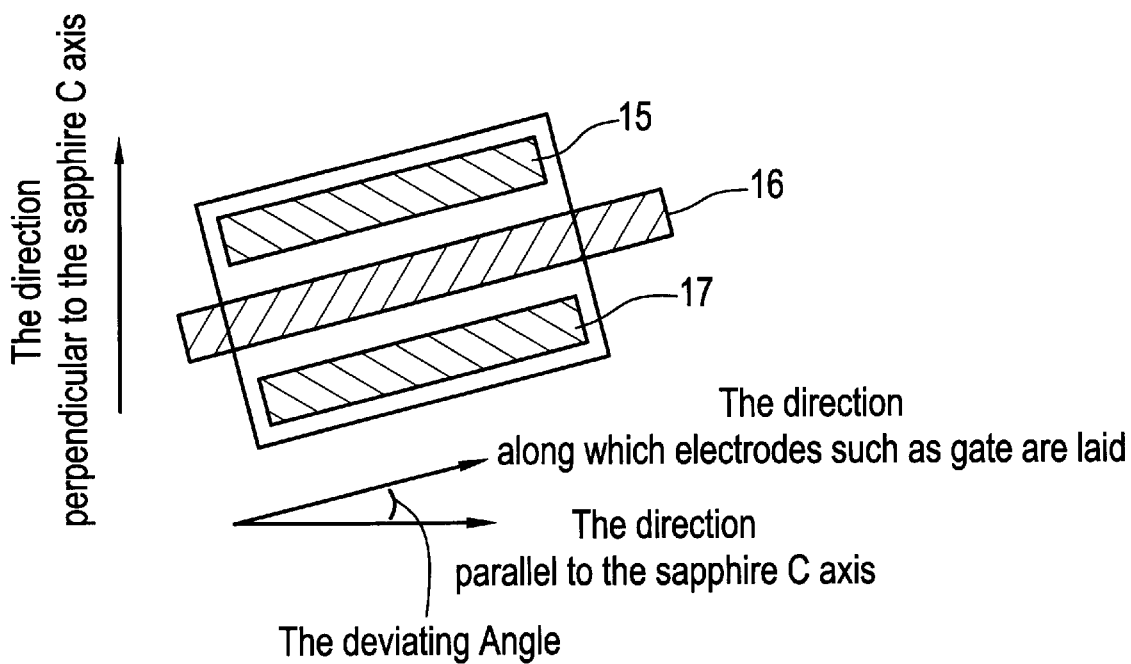

In the present example, the layout in plane of the FET was set, as shown in FIG. 2(a), where directions along which a gate electrode 15, source 15 and drain electrodes 16 lie was substantially parallel to the sapphire C axis. The direction of the drain current is, thus, substantially perpendicular to the sapphire C axis. As the orientation of the C axis within a wafer can be found out beforehand through measurements of X-ray analysis or such, it can be easily recognized by marking its direction with a notch or the like. Further, in mask design, if interconnections between FETs are laid in the direction parallel or perpendicular to that of the FETs, the area of a rectangular chip can be utilized effectively. Further, coplanar lines may be employed for interconnections and, in such a case, it is preferable to adjust impedances by varying spacing between lines, while taking the difference in permittivity into consideration.

Further, in a FET of the present example, the values of afore-mentioned parameters were as follows:

$S_{pad}/S_{gate}$ is 100;
$\epsilon_{sub}$ is 9.4;
$\epsilon_{epi}$ is approximately 9.0;
$t_{sub}$ is 30 μm; and
$t_{act}$ is 0.05 μm.

By substituting the above parameters into the aforementioned Equation (1), the range of the substrate thickness where the contribution of the parasitic capacitances due to the pad electrode becomes significant is given by $t_{sub} \leq 52$ μm.

In the present example, the substrate thickness was set to be 30 μm with a view of improving heat radiation characteristic and reducing parasitic capacitances in the direction of the substrate thickness. When the device is formed on a sapphire C plane as the conventional one, with a substrate thickness of this sort, the pad electrode parasitic capacitances cause a problem. In contrast with this, in the present example, such a problem is solved, because an A plane of sapphire is utilized as the plane for device formation.

A FET obtained in the present example demonstrated to have excellent productivity, heat radiation characteristic and performance in high speed operation.

Reference Example 1

Figure 7:
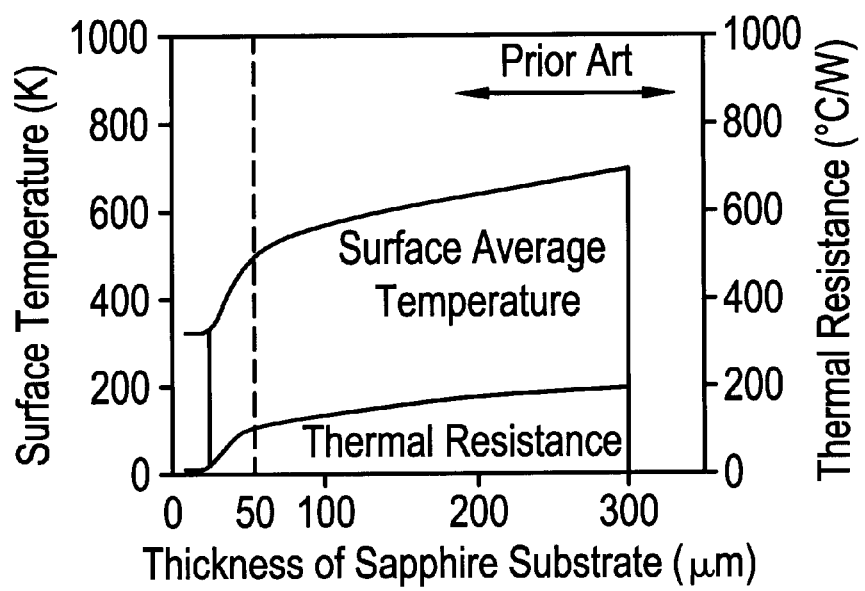
FIG. 7 is a graphical representation showing the dependences of thermal resistance and surface average temperature on substrate thickness, obtained by simulation.
Figure 8:
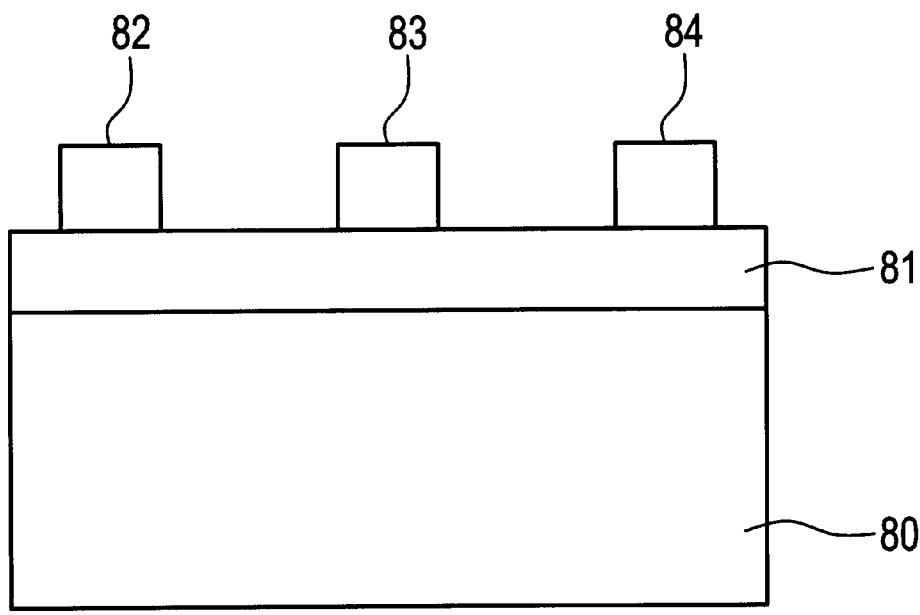
FIG. 8 is a view in explaining the device model subjected to analysis made by simulation of FIG. 7.

Subjecting a HEMT shown in FIG. 8 to analysis where a GaN based semiconductor layer 81 is formed upon a sapphire substrate 80 and a source electrode 82, a gate electrode 83 and a drain electrode 84 are formed thereon, the dependences of thermal resistance and surface average temperature on substrate thickness were obtained by simulation. The calculated results are shown in FIG. 7. The thermal resistance and surface average temperature each decrease with decreasing the substrate thickness, and show a marked decrease, especially in the region of thickness of 50 $\mu$m or less. These results confirm that, by setting the thickness of the sapphire substrate to be 50 $\mu$m or less, a noticeable effect to heat radiation can be attained.

Reference Example 2

A sapphire substrate with a thickness of 300 $\mu$m wherein an A plane was set to be the basal plane and another sapphire substrate with a thickness of 300 $\mu$m wherein a C plane was set to be the basal plane were prepared, and, after grinding, close inspection of their aspects were conducted. In the sapphire substrate wherein a C plane was set to be the basal plane, cracks appeared when its thickness became 70 $\mu$m or so. In contrast with this, in the sapphire substrate wherein an A plane was set to be the basal plane, cracks did not appear, even when the substrate thickness became as thin as 30 $\mu$m, showing nothing abnormal in appearance.

SUMMARY OF DISCLOSURE

As set forth above, in the present invention, upon an A plane of a single sapphire substrate, a group III nitride semiconductor layer is formed to construct a FET. This makes it possible to provide a good productivity as well as to improve heat radiation characteristic. Further, as the layout in plane of the FET is selected to satisfy a prescribed condition, a good performance in high speed operation can be achieved.

What we claim is:

1. A semiconductor device which comprises a group III nitride semiconductor layer formed on a single crystal sapphire substrate, a source electrode and a drain electrode formed apart from each other on the surface of said group III nitride semiconductor layer, and a gate electrode formed between said source electrode and said drain electrode; wherein said group III nitride semiconductor layer is formed on an A plane of said single crystalline sapphire substrate; and the source electrode, the drain electrode and the gate electrode are formed to lie along a direction which makes an angle within 20° with a C axis of said single crystalline sapphire substrate.

2. A semiconductor device according to claim 1, wherein said group III nitride semiconductor layer comprises an operation layer and an electron supply layer formed thereon, and a two-dimensional electron gas is formed at the interface of these layers.

3. A semiconductor device according to claim 1 or 2, wherein a thickness of said sapphire substrate is 100 $\mu$m or less.

* * * * *